United States Patent
Lee et al.

(10) Patent No.: US 7,782,977 B2
(45) Date of Patent: Aug. 24, 2010

(54) AUTOMATIC GAIN CONTROL APPARATUS AND METHOD IN ORTHOGONAL FREQUENCY DIVISION MULTIPLEXING

(75) Inventors: Yong-Su Lee, Daejeon (KR); Youn-Ok Park, Daejeon (KR); Jun-Woo Kim, Daejeon (KR); Dae-Ho Kim, Daejeon (KR)

(73) Assignees: Electronics and Telecommunications Research Institute (KR); Samsung Electronics Co., Ltd. (KR); KT Corporation (KR); SK Telecom Co., Ltd. (KR); KTFreetel Co., Ltd. (KR); Hanaro Telecom, Inc. (KR)

( * ) Notice: Subject to any disclaimer, the term of this patent is extended or adjusted under 35 U.S.C. 154(b) by 707 days.

(21) Appl. No.: 10/583,164

(22) PCT Filed: Dec. 17, 2004

(86) PCT No.: PCT/KR2004/003343

§ 371 (c)(1),
(2), (4) Date: May 25, 2007

(87) PCT Pub. No.: WO2005/060135

PCT Pub. Date: Jun. 30, 2005

(65) Prior Publication Data

US 2007/0248197 A1    Oct. 25, 2007

(30) Foreign Application Priority Data

Dec. 17, 2003    (KR) .................. 10-2003-0092317

(51) Int. Cl.
*H04K 1/02* (2006.01)

(52) U.S. Cl. ................................................ 375/296
(58) Field of Classification Search .............. 375/296, 375/345; 455/244.1, 246.1, 295, 311, 324
See application file for complete search history.

(56) References Cited

U.S. PATENT DOCUMENTS

| 3,678,393 | A | * | 7/1972 | Newell ................ 455/244.1 |
| 5,901,347 | A | * | 5/1999 | Chambers et al. ........ 455/234.1 |
| 6,574,292 | B2 | | 6/2003 | Heinonen et al. |

(Continued)

FOREIGN PATENT DOCUMENTS

JP          11-205278          7/1999

(Continued)

*Primary Examiner*—David C Payne
*Assistant Examiner*—Leon-Viet Q Nguyen
(74) *Attorney, Agent, or Firm*—The Farrell Law Firm, LLP

(57) ABSTRACT

Disclosed is an automatic gain control device in an orthogonal frequency division multiplexing system. A variable gain amplifier controls a gain of an input signal; an energy calculator calculates an energy of the input signal; a truncator accumulates the calculated energies, finds an average thereof, and generates a DC offset of the input signal; a subtracter subtracts a predefined reference value from the DC offset, and outputs a signal; and an RC filter feeds the value output by the subtracter back to the variable gain amplifier so that the value output by the subtracter may be used for an automatic gain control. The predefined reference value given to be 4.0v is a reference power generated based on a saturation to RMS ratio for minimizing the bit error rate of the orthogonal frequency division multiplexing system.

10 Claims, 4 Drawing Sheets

U.S. PATENT DOCUMENTS

2002/0186799 A1 * 12/2002 Sayeed .................. 375/345
2003/0199264 A1 * 10/2003 Holenstein et al. .......... 455/324

FOREIGN PATENT DOCUMENTS

| | | |
|---|---|---|
| JP | 2000-068973 | 3/2000 |
| JP | 2002-368715 | 12/2002 |
| KR | 10-2001-0028291 | 4/2001 |

* cited by examiner

AUTOMATIC GAIN CONTROL APPARATUS AND METHOD IN ORTHOGONAL FREQUENCY DIVISION MULTIPLEXING

BACKGROUND OF THE INVENTION (a) Field of the Invention

The present invention relates to an orthogonal frequency division multiplexing (OFDM) system. More specifically, the present invention relates to an automatic gain control device and method of the OFDM system.

(b) Description of the Related Art

Conventionally, an automatic gain control (AGC) process and a DC offset calculation process have been sequentially performed in the training symbol interval in the OFDM system, which will now be described.

FIG. 1 shows a configuration diagram of the preamble of the IEEE 802.11a WLAN.

As shown, the preamble has short training sequences and long training sequences. The short training sequences are used to detect signals, perform AGC, and estimate coarse frequency offsets, and the long training sequences are used to acquire fine symbol synchronization and estimate fine frequency offsets.

The training symbols are normalized, but data symbols are generated by performing inverse fast Fourier transform on data, and hence, their energy is not constant, and the AGC is performed by using the training symbols in the preamble interval.

An AGC device of the general OFDM system finds energy of input I and Q data, takes an average thereof, converts the average into a value [dB] to be compensated by the AGC device, feeds the difference between the converted value and a reference value back to the AGC device, and thus controls the gain in the training symbols. An important parameter in the above-noted AGC process is a reference power, and the bit error rate (BER) of the OFDM system can be reduced by controlling the reference power and controlling the gain. That is, variations of the reference power improve or deteriorate the total performance of the OFDM system.

SUMMARY OF THE INVENTION

It is an advantage of the present invention to provide an automatic gain control (AGC) device and method in an OFDM system for generating a reference power based on a saturation-to-RMS (SR) ratio which minimizes the BER, controlling the gain of the OFDM system according to the reference power, and thereby improving the performance of the OFDM system.

In one aspect of the present invention, an automatic gain control device in an orthogonal frequency division multiplexing system comprises: a variable gain amplifier for controlling a gain of an input signal; an energy calculator for calculating an energy of the input signal; a truncator for accumulating the calculated energies, finding an average thereof, and generating a DC offset of the input signal; a subtracter for subtracting a predefined reference value from the DC offset, and outputting a signal; and an RC filter for feeding the value output by the subtracter back to the variable gain amplifier so that the value output by the subtracter may be used for an automatic gain control.

The predefined reference value includes a reference power generated based on a saturation to RMS ratio for minimizing the bit error rate of the orthogonal frequency division multiplexing system, and the saturation to RMS ratio includes 4.0σ.

In another aspect of the present invention, an automatic gain control method in an orthogonal frequency division multiplexing system comprises: (a) calculating an energy of an input signal; (b) accumulating calculated energies, finding an average thereof, and generating a DC offset of the input signal; (c) subtracting a predefined reference value from the DC offset, and outputting a signal; (d) feeding the output signal back to another input signal to be provided after the above-noted input signal so that the output value may be used for an automatic gain control; and (e) using a saturation to RMS ratio which minimizes the bit error rate of the orthogonal frequency division multiplexing system, and generating the reference power.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Figure 1:
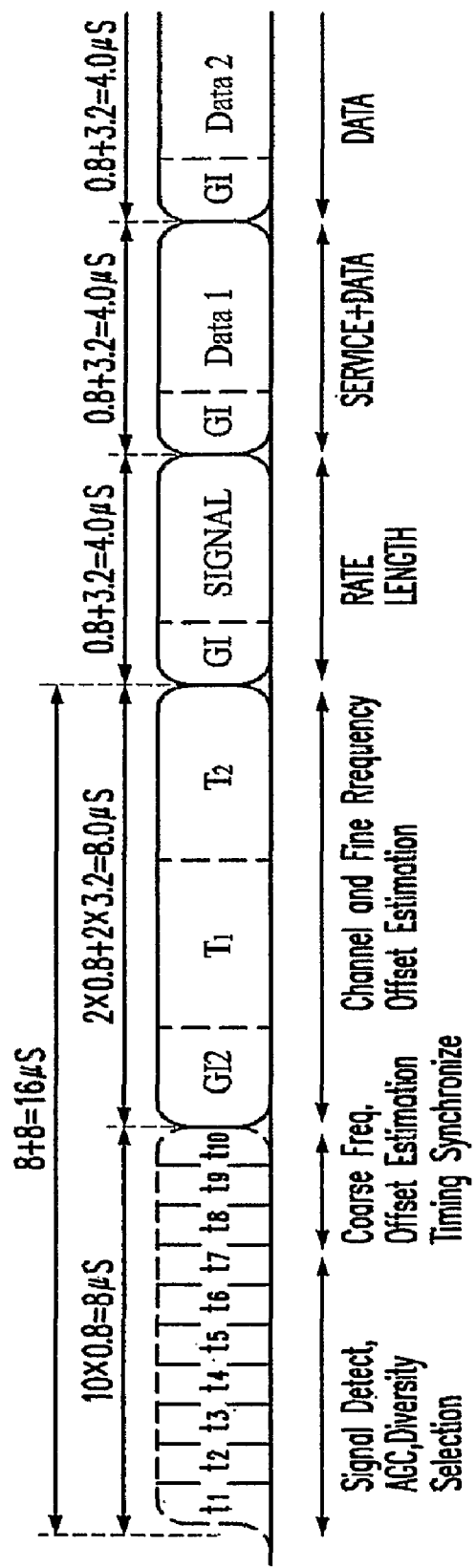
FIG. 1 shows a configuration diagram of the preamble of the IEEE 802.11a WLAN.

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts which are not described in the specification are omitted, and parts for which similar descriptions are provided have the same reference numerals.

Figure 2:
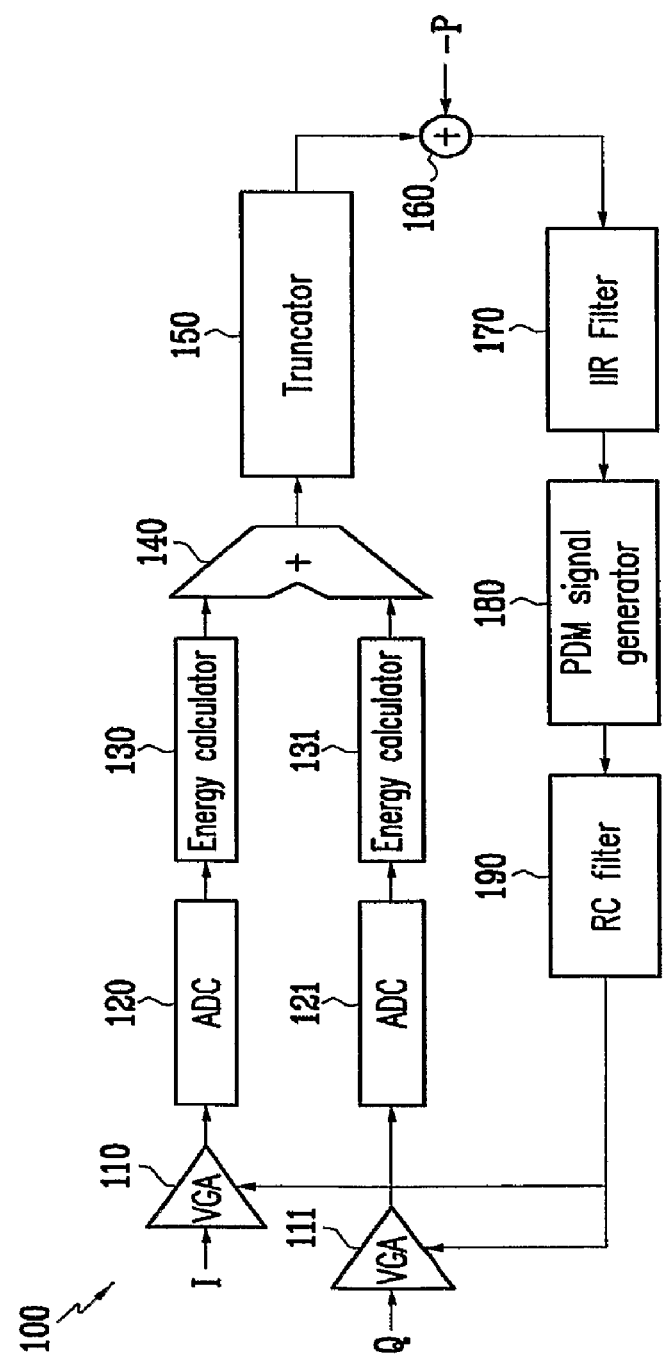
FIG. 2 shows a block diagram of an AGC device of an OFDM system according to an exemplary embodiment of the present invention.
Figure 4:
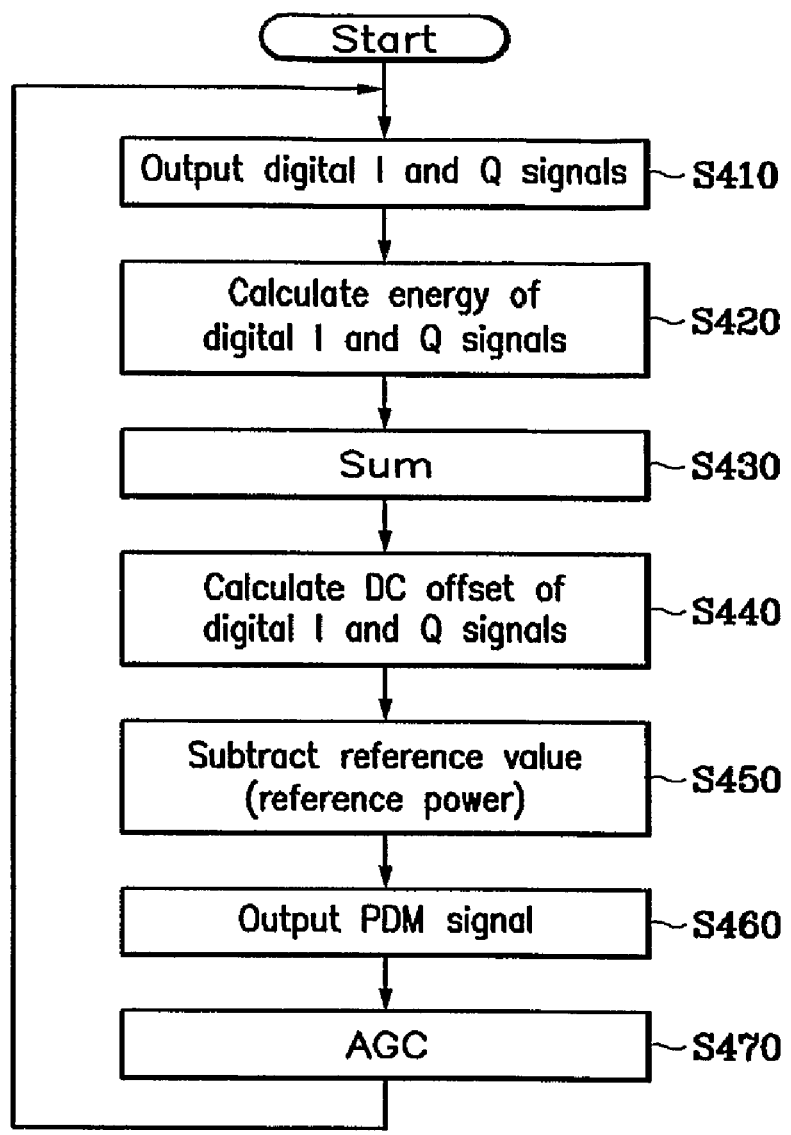
FIG. 4 shows an operational flowchart of an AGC device of FIG. 2.

FIG. 2 shows a block diagram of an AGC device of an OFDM system according to an exemplary embodiment of the present invention, and FIG. 4 shows an operational flowchart of an AGC device of FIG. 2.

As shown, the AGC device includes a plurality of variable gain amplifiers (VGAs) 110 and 111, a plurality of analog-to-digital converters (ADCs) 120 and 121, a plurality of energy calculators 130 and 131, an adder 140, a truncator 150, a subtracter 160, an infinite impulse response (IIR) filter 170, a pulse density modulation (PDM) signal generator 180, and an RC filter 190.

The ADCs 120 and 121 receive analog I and Q signals of training symbols from a radio frequency (RF) unit, convert the same into digital I and Q signals (referred to as I and Q signals hereinafter), and output the digital I and Q signals in Step S410.

The energy calculators 130 and 131 find the energy of the digital I and Q signals by calculating a summation of the square of the I and Q signals as the energy, and output the energy in Step S420.

The adder 140 adds the energies of the I and Q signals output by the energy calculators 130 and 131 in Step S430.

The truncator 150 accumulates the added energy for predetermined intervals, finds an average thereof, and outputs the average to thus generate an average of energy in Step S440.

In detail, the truncator 150 accumulates the energy of the I and Q signals output by the adder 140 for predetermined intervals, finds an average thereof, and outputs the average which is a DC offset of the I and Q signals.

The subtracter 160 subtracts a predefined reference value from the DC offset of the I and Q signals output by the truncator 150, and outputs a signal in Step S450. The predefined reference-value represents the reference power of Pref which is a parameter used to the AGC, and is obtained from simulations executed several times.

The process for calculating the reference power of Pref which is different from the reference power used by the OFDM system will be described.

The reference power of Pref is found by Equation 1.

$$P_{ref} = 2\sigma^2$$

$$\sigma = Q_{max}/SR\_RATIO$$

$$Q_{max} = 2^{N-1}$$

N=ADC bit resolution  Equation 1

Figure 3:
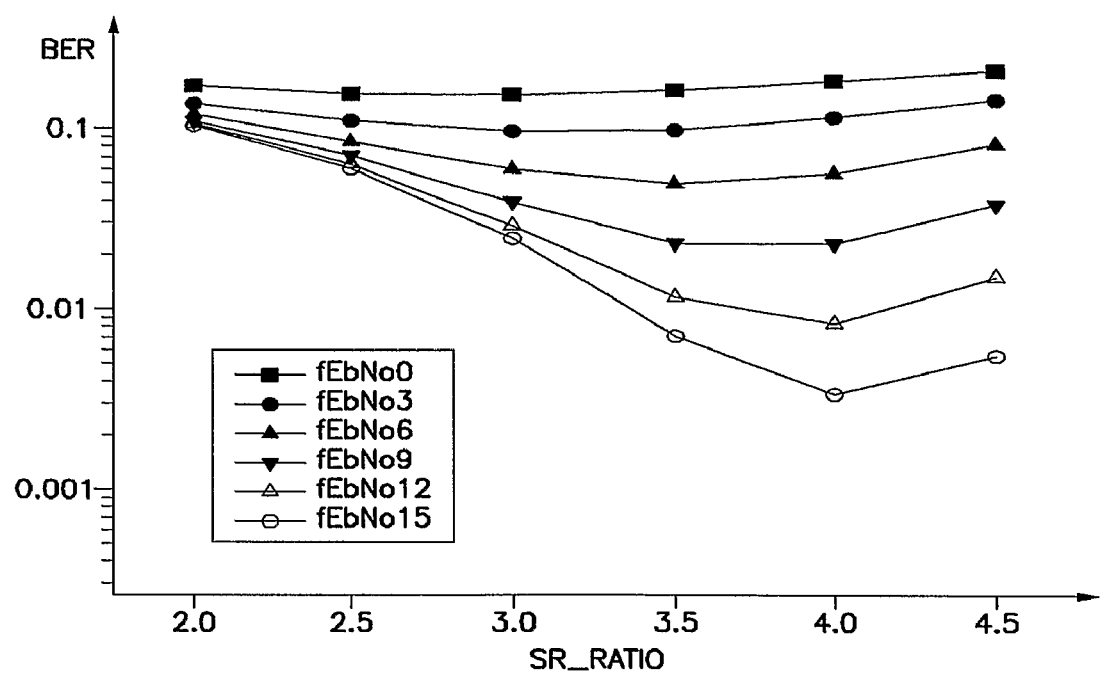
FIG. 3 shows a graph of BER with respect to SR ratio according to an exemplary embodiment of the present invention.

As can be known by Equation 1, the saturation to RMS (SR) ratio functions as an important parameter for calculating the reference power. When the SR ratio is given to be 4.0σ, the BER of the OFDM system is minimized, which represents performance improvement of the OFDM system, as shown in FIG. 3. The above-noted SR ratio of 4.0σ is obtained from repeated simulations.

The IIR filter 170 filters the subtraction value output by the subtracter 160, and the PDM signal generator 180 processes the signal output by the IIR filter 170 to be a PDM signal in Step S460.

The RC filter 190 feeds the PDM signal back to the VGAs 110 and 111 in an RF unit, and the VGAs 110 and 111 controls the gain of the I and Q signals of the externally received training symbols according to the PDM signal provided by the RC filter in Step S470.

Therefore, the AGC device of the OFDM system generates a reference power value based on the SR ratio for minimizing the BER, and controls the gain of the OFDM system according to the reference power value, thereby improving the performance of the OFDM system.

The corresponding AGC method of the OFDM system can be realized as a program and can be stored in computer-readable recording media (including a CD-ROM, a RAM, a ROM, a floppy disk, an HDD, and an optical disc.)

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An automatic gain control device in an orthogonal frequency division multiplexing system, comprising:
    a variable gain amplifier for controlling a gain of an input signal;
    an analog to digital converter for converting the input signal into a digital signal, and providing the digital signal to an energy calculator;
    the energy calculator for calculating an energy of the digital signal;
    a truncator for accumulating the calculated energies, finding an average thereof, and generating a Direct Current (DC) offset of the input signal;
    a subtracter for subtracting a predefined reference value from the DC offset, and outputting a signal;
    a pulse density modulation signal generator for processing the signal output by the subtracter to be a pulse density modulation signal; and
    a Resistor-Capacitor (RC) filter for feeding the value output by the pulse density modulation signal generator back to the variable gain amplifier so that the value output by the pulse density modulation signal generator may be used for an automatic gain control,
    wherein the predefined reference value includes a reference power generated based on a saturation to Root-Mean-Square (RMS) ratio for minimizing a bit error rate of the orthogonal frequency division multiplexing system.

2. The automatic gain control device of claim 1, wherein the saturation to RMS ratio includes 4.0σ.

3. The automatic gain control device of claim 1, wherein the energy for the automatic gain control is calculated for a training symbol interval of the input signal.

4. The automatic gain control device of claim 1, wherein the energy calculator finds a summation of the square of the input signal, and outputs the same as energy.

5. An automatic gain control method in an orthogonal frequency division multiplexing system, comprising:
    (a) converting, by an analog to digital convertor, an input signal into a digital signal, and providing the digital signal to an energy calculator;
    (b) calculating, by the energy calculator, an energy of the digital signal;
    (c) accumulating the calculated energies, finding an average thereof, and generating a Direct Current (DC) offset of the input signal;
    (d) subtracting, by a subtracter, a predefined reference value from the DC offset, and outputting a signal;
    (e) processing, by a pulse density modulation signal generator, the signal output by the subtracter to be a pulse density modulation signal; and
    (f) feeding, by a Resistor-Capacitor (RC) filter, the pulse density modulation signal back to another input signal to be provided after the above-noted input signal so that the output value may be used for an automatic gain control,
    wherein the predefined reference value includes a reference power generated based on a saturation to Root-Mean-Square (RMS) ratio for minimizing a bit error rate of the orthogonal frequency division multiplexing system.

6. The automatic gain control method of claim 5, wherein (b) comprises: finding a summation of the square of the input signal and outputting the same as energy.

7. The automatic gain control device of claim 1, further comprising an Infinite Impulse Response (IIR) filter for filtering a subtraction value output by the subtracter and outputting the filtered subtraction value to the pulse density modulation signal generator.

8. The automatic gain control device of claim 1, wherein the reference power is generated according to $$P_{ref} = 2\sigma^2$$

$$\sigma = Q_{max}/SR\_RATIO$$

$$Q_{max} = 2^{N-1}$$

where $P_{ref}$ is the reference power, N is an Analog-to-Digital Convertor (ADC) bit resolution, and SR_RATIO is the saturation to RMS ratio.

9. The automatic gain control method of claim 5, further comprising filtering a subtraction value output by the subtracter and outputting the filtered subtraction value to the pulse density modulation signal generator.

10. The automatic gain control method of claim 5, wherein the reference power is generated according to $$P_{ref}=2\sigma^2$$

$$\sigma=Q_{max}/SR\_RATIO$$

$$Q_{max}=2^{N-1}$$

where $P_{ref}$ is the reference power, N is an Analog-to-Digital Convertor (ADC) bit resolution, and SR_RATIO is the saturation to RMS ratio.

* * * * *